United States Patent [19]
Takagi et al.

[11] Patent Number: 5,155,378
[45] Date of Patent: Oct. 13, 1992

[54] PROCESS AND APPARATUS FOR ESTABLISHING A UNIQUE ADDRESS CODE ON AN INDIVIDUAL MODULE

[75] Inventors: Osamu Takagi, Odawara; Naoko Ezaki, Kamakura; Kiyohiko Tsutsumi, Isehara, all of Japan

[73] Assignee: NCR Corporation, Dayton, Ohio

[21] Appl. No.: 361,872

[22] Filed: Jun. 5, 1989

[30] Foreign Application Priority Data

Jul. 15, 1988 [JP] Japan .................. 63-175255

[51] Int. Cl.⁵ .................. H02H 7/20; H03K 3/26
[52] U.S. Cl. .................. 307/202.1; 307/303; 307/465.1; 357/40
[58] Field of Search ............ 307/303, 445, 463, 465.1, 307/202.1, 85, 78, 44; 357/40

[56] References Cited

U.S. PATENT DOCUMENTS

| | | | |
|---|---|---|---|
| 3,699,311 | 10/1972 | Dunbar | 235/61.11 |
| 3,851,314 | 11/1974 | Hedin | 340/147 MD |
| 3,928,750 | 12/1975 | Wolflingseder | 235/61.11 |
| 4,350,883 | 9/1982 | Lagarde | 235/435 |
| 4,438,347 | 3/1984 | Gehrig | 307/303 |
| 4,446,475 | 5/1984 | Gercekci et al. | 357/40 |
| 4,691,339 | 9/1987 | Redman et al. | 379/62 |
| 4,701,878 | 10/1987 | Gunkel et al. | 364/900 |
| 4,721,868 | 1/1988 | Cornell et al. | 307/463 |
| 4,797,578 | 1/1989 | Eriksson | 307/303 |
| 4,806,793 | 2/1989 | Golab | 307/202.1 |
| 4,896,060 | 1/1990 | Ma | 307/303 |
| 4,990,992 | 2/1991 | Uchida | 357/40 |

*Primary Examiner*—Edward P. Westin
*Assistant Examiner*—Richard Roseen
*Attorney, Agent, or Firm*—George J. Muckenthaler

[57] ABSTRACT

A printed circuit board includes at least one code establishing section which is readily removable or separated from the board and also includes printed wiring connected to a voltage source and to a ground. When the code establishing section is removed, the level of an output signal from the voltage source is inverted from the level of the output signal prior to removal of the code establishing section in order to establish a desired unique code. A second arrangement of the apparatus includes a main portion and two removable portions of the board with a pair of voltage sources on the main portion and a ground connection on one of the two removable portions. The method of establishing a unique address code is accomplished by removing one of the removable portions to provide an output signal of a level that is inverted from the level of an original signal. Subsequent removal of the other removable portion provides an output signal of a level that is the same level as the original signal.

20 Claims, 2 Drawing Sheets

PROCESS AND APPARATUS FOR ESTABLISHING A UNIQUE ADDRESS CODE ON AN INDIVIDUAL MODULE

BACKGROUND OF THE INVENTION

In the field of printed circuit boards, it is known that various types of devices and circuits are used to provide control of an electronic system. Binary "one" signals and binary "zero" signals are provided to inputs of the various types of devices used in the system. These signals provide direction and alteration of the function of a particular circuit in accordance with the type of business machine.

In one arrangement in the prior art, a predetermined portion of a print pattern on a flexible printed circuit board is disconnected to alter the function of the circuit. For example, Japanese Laid Open Utility Model Specification No. 123357/84 discloses a notch formed in a reinforcing plate to guide a cutting tool used in cutting a flexible circuit board. It is also known that a switch or a jumper wire may be used to set or alter the control code of a central processing or control unit. However, the use of a switch to alter an established code requires additional space in the control unit and also is more expensive. The use of a jumper wire is objectionable by reason that soldering or the like is required to connect the wire and it is difficult to establish a unique code.

Representative documentation in the field of changing modes of operation includes U.S. Pat. No. 3,699,311, issued to R. A. Dunbar on Oct. 17, 1972, which discloses a card and a card reader with plates forming capacitors in series to read bits of information encoded in the card when in the connected condition.

U.S. Pat. No. 3,851,314, issued to R. A. Hedin on Nov. 26, 1974, discloses a key actuated security system having an opening mechanism and an alarm device. The alarm device is actuated either by binary "1" to an input for which binary "0" is proper, or by binary "1" to fewer than all inputs for which binary "1" is proper. A portion of the system is switchable to change modes of operation.

U.S. Pat. No. 3,928,750, issued to H. Wolflingseder on Dec. 23, 1975, discloses a code card with first and second branch conductors wherein severance of one branch conductor results in a pattern of two different voltages upon insertion of the card into a decoder. Leads are connected to electrical midpoints of closed circuit loops which are connected as an AND gate to generate a voltage on an output terminal.

U.S. Pat. No. 4,350,883, issued to P. Lagarde on Sep. 21, 1982, discloses a method of marking and identifying objects by use of electrically conducting elements and detecting variations in response signals.

U.S. Pat. No. 4,446,475, issued to A. Gercekci et al. on May 1, 1984, discloses an IC chip having a memory wherein direct access to a portion of the memory is prevented. When the IC chip is removed from a wafer, the coupling lines which extend off the chip are destroyed so as to prevent such access.

U.S. Pat. No. 4,691,339, issued to M. J. Redman et al. on Sep. 1, 1987, discloses an address code arrangement in a cordless telephone wherein a PC board having a single common track is associated with label means having a plurality of conductive strips. A dialing connection is permitted only when a single address code is established.

And, U.S. Pat. No. 4,701,878, issued to H. D. Gunkel et al. on Oct. 20, 1987, discloses apparatus for assigning addresses to modules based on contact configuration. A module code is stored in each module in a first memory and a plug location code is sent to each module. A control unit sends the relevant addresses to the respective modules by addressing the plug location codes.

SUMMARY OF THE INVENTION

The present invention relates to a process and apparatus for establishing a unique address code on an individual module. The apparatus includes a printed circuit board having printed circuit wiring thereon that is a portion of a circuit connected to the module. A portion of such printed circuit wiring is cut or removed from the printed circuit board to establish a unique address code for the module.

In accordance with the present invention, there is provided an apparatus for establishing a unique code for a module comprising a printed circuit board having printed circuit wiring thereon. The circuit board has a main portion and removable first and second portions which include wiring thereon. The first and second portions are adaptable to be removed from the circuit board along with a portion of the wiring on the board. The main portion of the circuit board has a logic circuit connected to the printed circuit wiring thereon, in an arrangement wherein the level of an output signal of the logic circuit is changed from a first level to a second level when the first portion is removed from the circuit board. The logic circuit generates an output signal after removal of the second portion which is the same level as the signal which was generated prior to removal of the first portion of the circuit board.

In view of the above discussion, a principal object of the present invention is to provide a method and apparatus for establishing a unique code by altering a printed circuit board.

Another object of the present invention is to provide a desired unique code by removing a portion of the wiring on a printed circuit board.

An additional object of the present invention is to establish a desired code at a module of a control unit by altering the wiring on a printed circuit board.

A further object of the present invention is to provide a printed circuit board having at least one code establishing portion which is adapted to be readily removable from the board and which portion includes wiring that is connected to a logic circuit, the removal of such portion causing inversion of a signal generated from the board to establish a desired unique code.

Additional advantages and features of the present invention will become apparent and fully understood from a reading of the following description taken together with the annexed drawing.

DESCRIPTION OF THE PREFERRED EMBODIMENT

The present invention is directed to apparatus or structure that includes a printed circuit board having at least one code establishing portion which is provided to be readily removable or cut off from a main portion of the board. Print wiring on the board is connected to a power source and a ground and is connected to a logic circuit such that when the code establishing portion is removed, the level of a digital output signal from an output end of the circuit board wiring is inverted from the level of the signal before the code establishing portion was removed in order to set a desired unique code.

Figure 1:
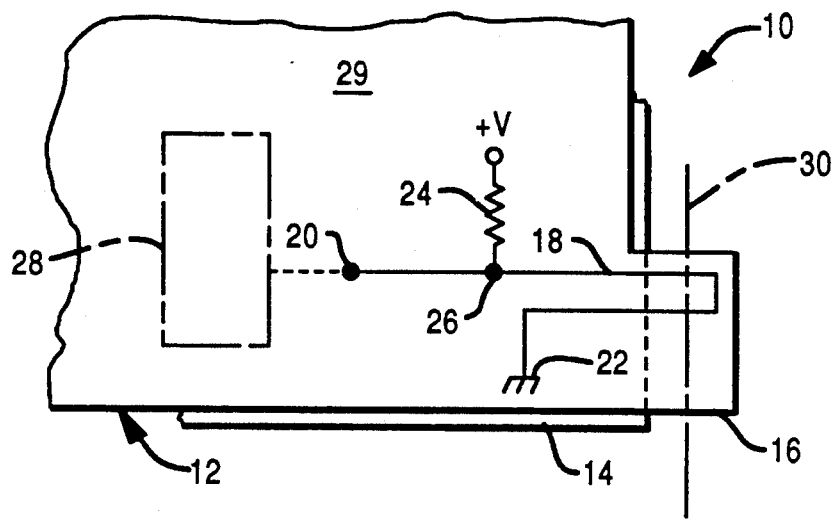
FIG. 1 is a partial plan view, in diagrammatic form, of a unique code establishing apparatus according to a first embodiment of the present invention.

A preferred embodiment of the present invention will be described with reference to the accompanying drawing. FIG. 1 shows a first embodiment of the present invention wherein the apparatus 10 includes a part of a flexible printed circuit board 12 and a reinforcing plate 14 for supporting the printed circuit board 12 thereon. The printed circuit board 12 includes a code establishing section 16 which constitutes a portion of the printed circuit board 12 and projects beyond the edge of the reinforcing plate 14 in manner and position to be cut off or otherwise removed from the circuit board 12. Printed circuit wiring 18 is provided on the printed circuit board 12 and is routed from an output 20 of the board 12 and passes through the code establishing section 16 and is connected to a ground 22. The printed circuit wiring 18 is connected to a power source $+V$, of suitable potential, through a resistor 24 at a connecting point 26 near the output 20.

A control unit 28, such as a central processing unit (CPU) or a controller, is provided on a main portion 29 of the printed circuit board 12 and the output 20 of the printed circuit wiring 18 is connected to an input terminal of the control unit 28. The control unit 28 determines a unique code (for example, an address code) by a conventional technique with the use of well-known means in accordance with an output signal from the output 20. In the state shown in FIG. 1, a low level output signal is generated at the output 20 of the printed circuit wiring 18, so that an address is set to "0".

In one aspect of the practice of the invention, the code establishing section 16 is cut off or otherwise removed along a chain line 30, the supply voltage $+V$ is thereby directly applied to the output 20, and a high level signal is input to the control unit 28, so that the address code is established or set to "1". The flexible printed circuit board 12 is sufficiently soft to enable the section 16 to be readily cut off with a pair of scissors. A plurality of unique codes can be established with the provision of a plurality of code establishing sections 16 and the printed circuit wiring 18 of the above-mentioned type, all as desired or as required. The provision of two code establishing sections 16 with the appropriate printed circuit wiring 18 permits the establishing of four unique codes (for example, addresses 0-3).

Figure 2:
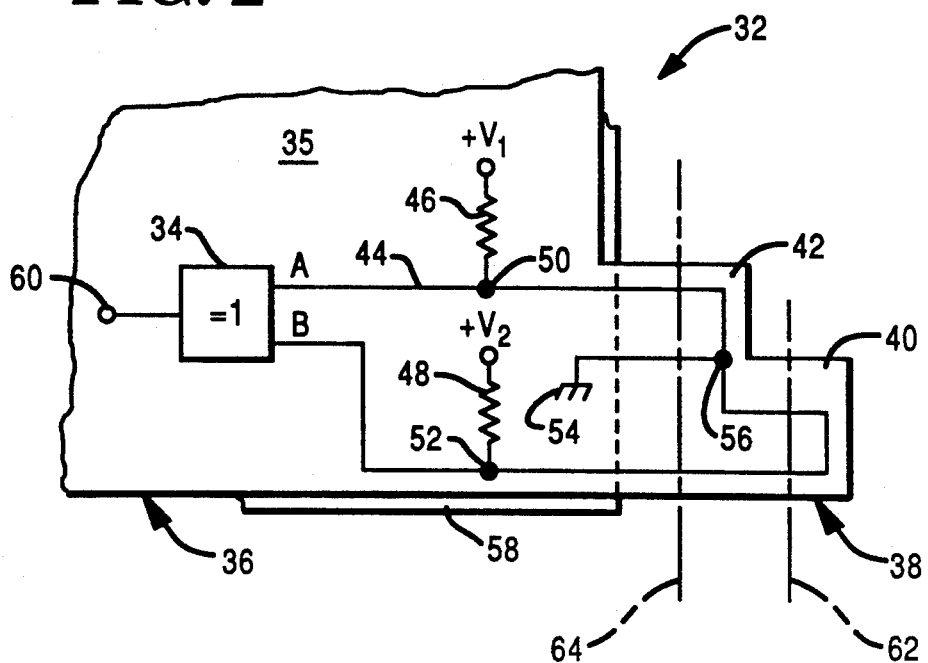
FIG. 2 is a partial plan view, in diagrammatic form, of the apparatus according to a second embodiment of the invention.

FIG. 2 shows a second embodiment of the invention wherein the structural arrangement is similar to that of FIG. 1. The unique code establishing apparatus 32 includes an exclusive OR gate 34 which is provided on a main portion 35 of a flexible printed circuit board 36, a signal establishing section 38 comprised of a part of the printed circuit board 36 and having first and second removable sections or portions 40 and 42, and printed circuit wiring 44. As shown in FIG. 2, the printed circuit wiring 44 extends from an input terminal A of the exclusive OR gate 34 to the other input terminal B of the exclusive OR gate 34 after passing through the first and second removable sections 40 and 42 of the printed circuit board 36. The printed circuit wiring 44 is connected at a connecting point 50 to a power source $+V_1$ through a resistor 46. The printed circuit wiring 44 is also connected at a connecting point 52 to a power source $+V_2$ through a resistor 48. The power sources $V_1$ and $V_2$ are of the same potential, which may be a nominal $+5$ volts. The printed circuit wiring 44 is also connected to a ground 54 at a connecting point 56 located in the second removable section 42 of the part 38 of the printed circuit board 36. The printed circuit board 36 is supported on a reinforcing plate 58. Accordingly, and as seen from the state of the circuit shown in FIG. 2, low level signals are input through the wiring 44 to the input terminals A and B of the exclusive OR gate 34 by reason of the ground connection 54 being applied to a part of the wiring 44. In this manner, the exclusive OR gate 34 outputs a low level signal to an output 60 of the gate.

When it is desired to change the level of the signal at output 60 of the gate 34, the first removable section 40 is cut off along a line 62. A low level signal from the ground 54 continues to be input to the input terminal A of the exclusive OR gate 34. However, the signal applied to the other input terminal B of the OR gate 34 goes to a high logic level due to the application of the supply voltage $+V_2$ thereto through the resistor 48, since the ground connection 54 has been removed from this portion of the circuit. Therefore, the exclusive OR gate 34 generates a high level signal from the output 60 thereof.

In the case wherein following removal of the first section 40, the second removable section 42 is also removed by being cut off along a line 64, the supply voltages $+V_1$ and $+V_2$ are supplied to the input terminals A and B of the exclusive OR gate 34 through the resistors 46 and 48, because of the elimination of the ground connection 54 from both portions of the circuit, so that high level signals are input to both input terminals A and B. Hence the exclusive OR gate 34 generates a low level output signal from the output 60 thereof. The state of this low level output signal is the same as that obtained before the first removable section 40 was cut off the circuit board 36 along the line 62. Accordingly, if the removable section 40 has been cut off in error or a code which has been once set should be altered, the code can be corrected or altered by removal of the second removable section 42. In this regard, other suitable logic elements may be substituted for the exclusive OR gate 34.

Figure 3A:
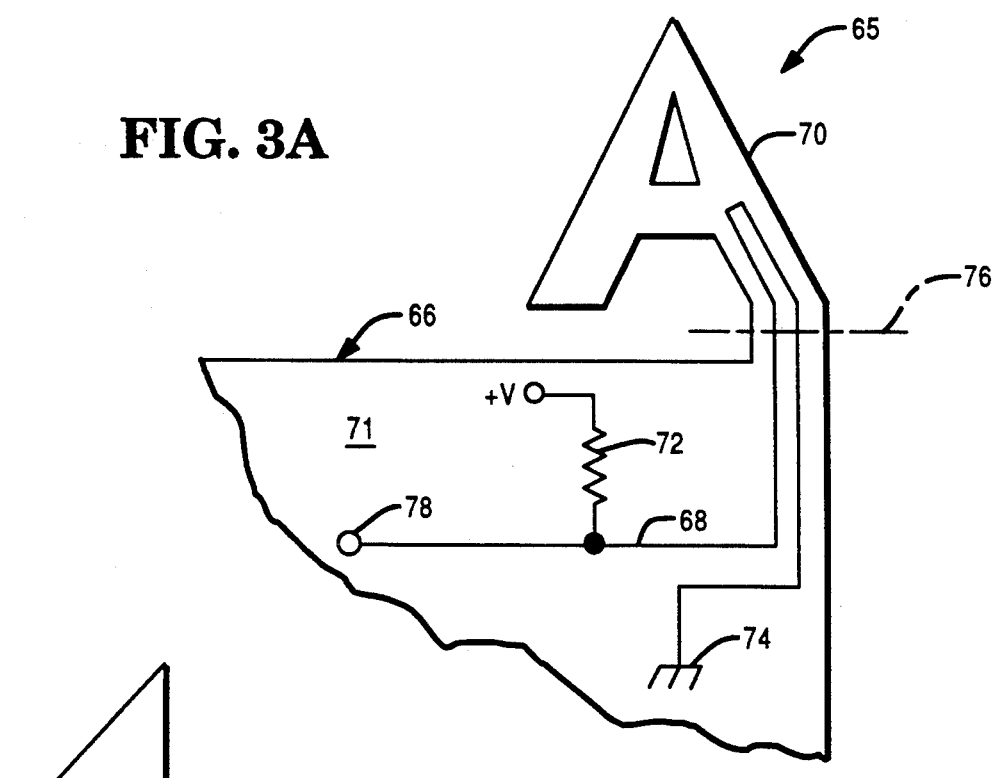
FIGS. 3A and 3B are partial plan views, in diagrammatic form, of the apparatus according to third and fourth embodiments of the invention.
Figure 3B:
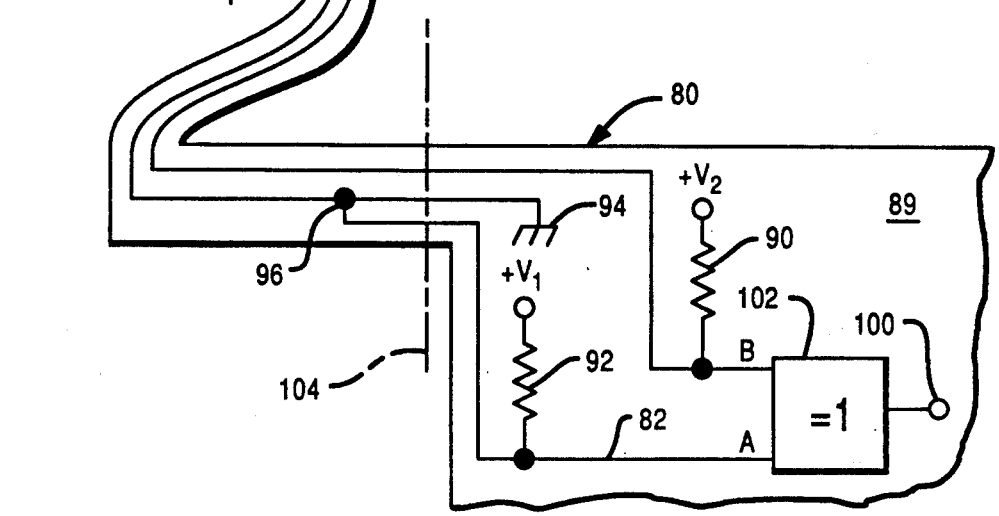

FIGS. 3A and 3B show third and fourth embodiments of the invention utilizing diagrammatic illustrations of printed circuit boards. The third embodiment of FIG. 3A is constructed such that a portion of the circuit board can be readily identified so as to avoid error in removing a portion. The embodiment of a code establishing apparatus 65 shown in FIG. 3A includes a printed circuit board 66 with printed circuit wiring 68 thereon. The printed circuit wiring 68 is constructed in similar manner as the wiring 18 in the first embodiment. However, a code establishing section 70 is shaped into the form of a symbol, such as, for example, the letter "A". A voltage $+V$, on a main portion 71 of the printed circuit board 66, is applied through a resistor 72 to the wiring 68 and the wiring is connected to a ground 74 and to an output 78. When the "A" shaped form 70 is cut off along a line 76, the effect of the ground 74 is eliminated from the circuit, so that the signal level at the output 78 of the wiring 68 is inverted. The output 78 may be utilized in a manner similar to the use of the output 20 shown in FIG. 1.

The fourth embodiment shown in FIG. 3B includes a printed circuit board 80 with printed circuit wiring 82 thereon. The wiring 82 is constructed in similar manner to the wiring 44 in the embodiment of FIG. 2 and is constructed such that a first removable section 84 and a second removable section 86 of a code establishing apparatus 88 are respectively shaped into the forms of two symbols, such as, for example, the numerals "1" and "2". A pair of sources of equal voltages, located on a main portion 89 of the printed circuit board and indicated as $+V_1$ and $+V_2$, are applied to the wiring 82 through resistors, such as 92 and 90, respectively, and the wiring is connected to a ground 94 at a connection 96. The sources $+V_1$ and $+V_2$ are connected through the resistors 92 and 90 to inputs A and B of an exclusive OR gate 102 having an output 100. In the state of the embodiment of FIG. 3B as shown, the logic levels of the signals at the inputs A and B of the gate 102 are at ground, due to the ground connection 94.

When the numeral "1" portion 84 of the printed circuit board 80 is cut off along a line 98, such removal of portion 84 causes the level of the signal at input B to rise to a high logic level, while the level of the signal at input A remains at ground. This causes an inversion of the signal at output 100 of the exclusive OR gate 102. When the numeral "2" portion 86 is subsequently cut off along a line 104, such removal of portion 86 causes the effect of the ground 94 to be eliminated from the circuit applied to input A of the gate 102, so that the signal level at input A changes to a high logic level. These input signals at inputs A and B provide a signal at output 100 which is the same as the level appearing at output 100 before the first cut off section 84 was removed.

As has been described above, a unique code for a control unit or like module can be set by cutting off a portion of the printed circuit board as required. A unique code setting device is thus provided which is less costly and is superior to conventional devices in methods of packaging and operability. In addition, the cut off section can be shaped into any given configuration and a portion to be cut off can be accurately designated in a specification or the like, so that errors in establishing a code can be eliminated. Further, the use of the exclusive OR gate provides such an effect that the code which has been established can be altered and any errors in establishing the code can be corrected.

It is thus seen that herein shown and described is an apparatus using a circuit board with one or more removable portions to establish a desired code for a control unit. The present invention enables the accomplishment of the objects and advantages mentioned above, and while a preferred embodiment of the invention has been disclosed herein, variations thereof may occur to those skilled in the art. It is contemplated that all such variations and modifications not departing from the spirit and scope of the invention hereof are to be construed in accordance with the following claims.

What is claimed is:

1. A method of establishing a unique code for a control unit capable of producing an output signal representing said code, using a circuit board having printed circuit wiring thereon, said wiring including an input connection to said control unit, a voltage source and a ground connection, the method comprising the steps of:
   determining the level of an input signal from the printed circuit wiring to the control unit, and
   removing a first portion of the circuit board and a portion of the wiring coupling the ground connection to the voltage source, the removal of such wiring portion inverting the level of the input signal to the control unit from the level of said input signal prior to removal of said circuit board portion and said wiring portion, to cause an inversion of the output signal from said control unit.

2. The method of claim 1 wherein the step of removing said portion of the circuit board is effected by cutting off such portion.

3. The method of claim 1, in which said wiring includes a second input connection to said control unit and a second voltage source, and including the step of removing a second portion of the printed circuit board having said ground connection thereon, subsequent to removal of the first portion, the removal of the second portion inverting the level of the second input connection to said control unit, to cause a further inversion of the output signal from said control unit to the level of such output signal prior to removal of the first portion.

4. The method of claim 1 wherein the portion of the circuit board is in the form of a symbol.

5. The method of claim 3 wherein the first portion and the second portion of the circuit board are in the form of symbols.

6. An apparatus for establishing a unique code for a control unit having at least one input and an output, comprising a
   printed circuit board including a first portion having said control unit thereon and a removable second portion; and
   printed circuit wiring on said first and second portions of said circuit board and connected to an input of said control unit to provide an input signal of a predetermined level to the control unit, said wiring including a voltage source and a ground connection, said second portion with wiring thereon comprising a code establishing section of the circuit board and removable from said first portion, the removal of said second portion of the circuit board removing the wiring which couples the ground connection to the voltage source and effecting an interruption in the wiring, such interruption in the wiring causing the level of an output signal on the output of the control unit to be inverted from the level of such signal prior to removal of said second portion of the circuit board whereby the inverted level of said output signal establishes a desired code for said control unit.

7. The apparatus of claim 6 wherein the voltage source and the ground connection are located on the first portion of the circuit board.

8. The apparatus of claim 6 including a support for said circuit board and wherein said second portion of said circuit board extends beyond the board support to enable cutting off the second portion and the wiring thereon.

9. The apparatus of claim 7 wherein the wiring is connected at one end thereof to said at least one input of said control unit, the wiring is connected through a resistor to said voltage source, and the wiring is connected to said ground connection after passing through the removable portion of the circuit board.

10. The apparatus of claim 6 in which said wiring includes a second input connection to said control unit and a second voltage source, and in which a part of the first portion of the circuit board is removable, the removal of said part of said first portion subsequent to removal of the second portion inverting the level of the output signal to the level of such output signal prior to removal of the first portion.

11. The apparatus of claim 6 wherein the second portion of the circuit board is in the form of a symbol.

12. The apparatus of claim 10 wherein said part of said first portion and said second portion of the circuit board are in the form of symbols.

13. The apparatus of claim 10 in which the control unit comprises an exclusive OR gate.

14. An apparatus for establishing a desired code for a control unit having an output and at least one input, comprising a circuit board having a main portion, a first portion and a second portion, said main portion including voltage source means and said second portion including a ground connection; and printed circuit wiring on said main portion of said circuit board and on said first portion and on said second portion, said wiring being connected to said voltage source means and to said ground connection and to said control unit to provide an input signal of a predetermined level to an input of said control unit;

the removal of the first portion of said circuit board and the wiring thereon effecting an interruption in the wiring between said ground connection and said at least one input of said control unit, such interruption causing the level of the output signal at the output of said control unit to be inverted from an original level of the signal prior to removal of said first portion whereby the inverted level of the output signal establishes a desired code for said control unit, and the subsequent removal of said second portion effecting an interruption in the wiring thereon and such interruption in the wiring on said second portion resulting in an output signal level on the output of said control unit corresponding to the original level of the output signal.

15. The apparatus of claim 14 wherein the control unit comprises an exclusive OR gate.

16. The apparatus of claim 14 wherein said voltage source means includes a pair of voltage sources on said main portion and wherein said wiring includes a ground connection on said second portion.

17. The apparatus of claim 14 including a support for said circuit board and wherein said first portion and said second portion extend beyond the circuit board support to enable cutting off the first and second portions and the wiring thereon.

18. The apparatus of claim 14 wherein the first portion of the circuit board is in the form of a symbol.

19. The apparatus of claim 14 wherein the second portion of the circuit board is in the form of a symbol.

20. An apparatus for establishing a desired code for an exclusive OR control unit having a first input and a second input and an output, said apparatus comprising a printed circuit board having a main portion, a first portion and a second portion, said main portion having a first voltage source and a second voltage source and said second portion having a ground connection; and printed circuit wiring on said main portion and including a first resistor connected to said first voltage source and to said first input of said exclusive OR control unit and a second resistor connected to said second voltage source and to said second input of said exclusive OR control unit, said wiring also being connected between said first and said second resistors and said ground connection, to provide input signals of a predetermined level to said control unit, the removal of the first portion of said printed circuit board and the wiring thereon effecting an interruption in the wiring between said ground connection and said second resistor, such interruption causing the level of an input signal at the second input of said control unit to be inverted from said predetermined level of the signal prior to removal of said first portion whereby the level of the output signal of said control unit is inverted to establish a desired code at the output of said control unit, and the subsequent removal of said second portion of said printed circuit board and the wiring thereon effecting the removal of the ground connection and causing an interruption in the wiring between said ground connection and said first resistor, such removal of said second portion resulting in an inverted input signal level at the first input, which produces an output signal at the output of said control unit corresponding to the predetermined level of the output signal prior to the sequential removal of the first and second portions of said printed circuit board.

* * * * *